(12) United States Patent
Koyanagi et al.

(10) Patent No.: US 7,550,802 B2
(45) Date of Patent: *Jun. 23, 2009

(54) NONVOLATILE SEMICONDUCTOR MEMORY DEVICE AND MANUFACTURING PROCESS OF THE SAME

(75) Inventors: Mitsumasa Koyanagi, 22-5, Yurigaoka 1-chome, Natori-shi, Miyagi (JP) 981-1245; Masaaki Takata, Miyagi (JP)

(73) Assignees: Asahi Glass Company, Limited, Tokyo (JP); Mitsumasa Koyanagi, Natori-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/033,142

(22) Filed: Jan. 12, 2005

(65) Prior Publication Data
US 2005/0122775 A1  Jun. 9, 2005

Related U.S. Application Data

(63) Continuation of application No. PCT/JP03/09335, filed on Jul. 23, 2003.

(30) Foreign Application Priority Data
Jul. 23, 2002  (JP) ............................. 2002-213900

(51) Int. Cl.
*H01L 29/792* (2006.01)
(52) U.S. Cl. .................. 257/324; 257/411; 257/315; 257/E29.309; 977/773; 977/936; 438/216
(58) Field of Classification Search ................ 257/324, 257/411, E29.309, E21.091, E21.1; 438/288, 438/216, 287, 289, 513, 590, 593; 977/773, 977/936, 943
See application file for complete search history.

(56) References Cited
U.S. PATENT DOCUMENTS
4,949,136 A * 8/1990 Jain ........................... 257/344

(Continued)

FOREIGN PATENT DOCUMENTS
JP          9-36317         2/1997

(Continued)

OTHER PUBLICATIONS

Sandip Tiwari, et al., "Volatile and Non-Volatile Memories in Silicon with Nano-Crystal Storage", IEDM 95, IEEE, Dec. 10-13, 1995, pp. 521-524.

(Continued)

*Primary Examiner*—Tu-Tu V Ho
(74) *Attorney, Agent, or Firm*—Oblon, Spivak, McClelland, Maier & Neustadt, P.C.

(57) ABSTRACT

A nonvolatile semiconductor memory device which can shorten data writing and erasing time, significantly improve the endurance characteristic and be activated with low power consumption includes an insulating layer with electric insulation, wherein, a charge retention layer formed adjacent to a tunnel insulating film contains nano-particles comprised of a compound which is constituted from at least one single-element substance or chemical compound having a particle diameter of at most 5 nm functions as a floating gate, and which are independently dispersed with a density of from $10^{+12}$ to $10^{+14}$ particles per square centimeter.

4 Claims, 2 Drawing Sheets

U.S. PATENT DOCUMENTS

| | | | |
|---|---|---|---|
| 6,297,095 B1 * | 10/2001 | Muralidhar et al. | 438/257 |
| 6,413,819 B1 * | 7/2002 | Zafar et al. | 438/257 |
| 6,548,825 B1 * | 4/2003 | Yoshii et al. | 257/24 |
| 6,878,549 B1 | 4/2005 | Yamazaki et al. | |
| 6,918,946 B2 * | 7/2005 | Korgel et al. | 75/362 |
| 6,984,842 B1 * | 1/2006 | Nayfeh et al. | 257/14 |
| 2002/0061646 A1 | 5/2002 | Kan et al. | |
| 2002/0076850 A1 | 6/2002 | Sadd et al. | |
| 2003/0077863 A1 * | 4/2003 | Choi et al. | 438/257 |
| 2003/0132432 A1 * | 7/2003 | Yoshii et al. | 257/17 |
| 2003/0151948 A1 * | 8/2003 | Bhattacharyya | 365/185.18 |
| 2003/0235064 A1 * | 12/2003 | Batra et al. | 365/100 |
| 2005/0122775 A1 | 6/2005 | Koyanagi et al. | |

FOREIGN PATENT DOCUMENTS

| | | |
|---|---|---|
| JP | 10-256403 | 9/1998 |
| JP | 11-87544 | 3/1999 |
| JP | 2000-22092 | 1/2000 |
| JP | 2000-87233 | 3/2000 |
| JP | 2001-313342 | 11/2001 |
| JP | 2002-100687 | 4/2002 |
| JP | 2002-222880 | 8/2002 |
| WO | WO 01-57927 A1 | 8/2001 |

OTHER PUBLICATIONS

Ya-Chin King, et al., "Charge-Trap Memory Device Fabricated by Oxidation of $Si_{1-x}Ge_x$", IEEE Transactions on Election Devices, vol. 48, No. 4, Apr. 2001, pp. 696-700.

U.S. Appl. No. 11/003,421, filed Dec. 6, 2004, Takata et al.

U.S. Appl. No. 11/033,142, filed Jan. 12, 2005, Koyanagi et al.

U.S. Appl. No. 11/685,077, filed Mar. 12, 2007, Takata et al.

Paulun, et al., "The Multi-Tunnel Junction Single Electron Memory: Architecture and Simulation", Extended Abstracts of the 1999 International Conference on Solid State Devices and Materials, Tokyo, 1999, pp. 88-89.

* cited by examiner

NONVOLATILE SEMICONDUCTOR MEMORY DEVICE AND MANUFACTURING PROCESS OF THE SAME

TECHNICAL FIELD

The present invention relates to a nonvolatile semiconductor memory device and a process for manufacturing the same, specifically, a nonvolatile semiconductor memory device which has a structure constituted from an insulating matrix having nano-particles that are comprised of at least one type of single-element substance or at least one type of chemical compound and are dispersed with high density, and which has a charge retention layer having an excellent retention ability, and a process for manufacturing the device at a low cost and with good reproducibility.

BACKGROUND ART

Conventionally, as recording media that can record and rewrite a large volume of data, memory devices employing a semiconductor, such as DRAMs or SRAMs, and rotating disk type recording media, such as hard disks, magnetic optical disks or an optical disks, have been available. Systems employing any one of the recording media have been developed and used. Among these recording media, DRAMs, which are characterized by, e.g., fast writing and reading speed of data and easy high integration, have been broadly employed as a main memory device for a personal computer. However, because DRAMs have volatility characteristic (that is, stored data are lost when power supply from an external power source is stopped) that is fatal to a memory, the DRAMs have caused, e.g., problems that it takes much time to start up a personal computer employing a DRAM, and that prepared data are lost by, e.g., a sudden stop of power supply or failure to store the data.

On the other hand, although hard disk systems do not have volatility characteristic of data, these systems have caused problems of slow writing and reading speed and relatively high power consumption. For such reasons, the advent of a memory has been expected, which has characteristics, e.g., convenience in use, such as fast writing and reading speed, low power consumption, and non-volatility.

As memories that satisfy the above requirements, nonvolatile semiconductor memory devices, such as flash memory, ferroelectric memory, MRAM (Magnetic Random Access Memory) and phase change memory, have been expected and been under development.

Each of the memories have both advantages and disadvantages. For example, MRAM has lots of merits, such as fast writing speed and an excellent endurance, therefore it has been said to be one of the leading candidates as replacements for DRAM. However, since MRAM cell composes a transistor and a TMR (Tunnel Magneto Resistive) element, which makes disadvantageous in manufacturing cost due to its relatively complicated cell structure, and MRAM also has to employ a ferromagnetic material involving many technical problems in terms of process. And, more importantly, there is a problem that the manufacturing technology for TMR element with minimized dispersions in characteristics is difficult to be established.

On the other hand, flash memory can have a cell size reduced due to its simple structure with one transistor basically. Additionally, highly integrated flash memory can be relatively inexpensively produced by employing a conventional DRAM technology. For such reasons, attention has been drawn to flash memory as a frontrunner in several nonvolatile memories for a personal digital assistant (mobile information device). Recently, it has been promoted to operate semiconductor devices faster and to fabricate semiconductor devices in high integration. Being affected by this trend, research has actively conducted for providing flash memory with high performance, such as fast operation, miniaturization or an improved charge retention ability.

When NOR flash memory are given as an example of currently dominant floating-gate type flash memory, reading of stored data from a designated memory cell is rapidly carried out in a relatively short time of about 100 ns (nanosecond) or less. NOR flash memory have more than a half share in the flash memory market, for being used for storing, e.g., a program code of a mobile information device.

On the other hand, a data is written by hot electron injection from a channel to a floating gate. And, a data is erased by discharge due to a Fowler-Nordheim tunneling current from the floating gate to a channel forming region or to a source. The hot electron injection is fast in terms of charge transfer speed, but low in terms of charge injection efficiency (proportion of an injecting current to a supply current). And then the Fowler-Nordheim tunneling current at discharging is high in terms of the charge injection efficiency, but slow in terms of the charge transfer speed. Consequently, both require much time for rewriting.

Specifically, it takes a relatively long time on the order of 1 μs (microsecond) for writing and on the order of from several hundreds of ms (millisecond) to several seconds (second) for erasing. For this reason, it has been difficult to replace high-speed memory, such as DRAM, by flash memory, since, although flash memory are relatively easy to increase capacity and reduce costs, the application of the flash memory is limited.

In order to shorten the writing time to overcome such a drawback, for example, it is proposed to reduce the physical thickness of an oxide film which is the tunnel insulating film of a memory cell. However, if the thickness is reduced, dielectric breakdown (stress-induced leakage current) of the oxide film is likely to be caused by a stress, which is caused by charges passing many times through the oxide film due to repeated rewriting since the tunnel oxide film is subjected to a very strong electric field in inverse proportion to the thickness when the floating gate is electrically charged.

If dielectric breakdown occurs even at one location in a tunnel oxide film, most amount of charges retained in the floating gate leaks out, and the memory cell loses data retention ability afterward. This makes it difficult to improve the endurance characteristic of flash memory. Therefore, since there is not other choice but to form the tunnel oxide film to be as thick as about 10 nm in order to obtain the reliability of charge retention, it is difficult to shorten the time of rewriting under the present circumstances. Additionally, since the dimensions of the oxide film thickness and the entire cell have to be shrunk similarly, miniaturization of the entire cell size is also hampered.

As means for preventing the charge retention ability from being lowered by dielectric breakdown while maintaining high speed performance, there is a method for retaining charges in a spatially discrete manner. As a nonvolatile semiconductor memory employing such a method, there is MONOS (Metal-Oxide-Nitride-Oxide-Semiconductor). An example of conventional MONOS memory is shown in FIG. 3. The shown MONOS memory has such a structure that a $SiN_x$ film 5, instead of the floating gate, is stacked upon a tunnel insulating film 2 as shown in FIG. 3. The MONOS memory is a memory which retains charges in interface levels 4a existing at the interfaces and in trap levels 4b discretely distributed in the SiN$_x$ film 5. Additionally, in FIG. 3, reference numeral 1 designates a p-type single crystal Si substrate, reference numeral 4 is a charge retention region, reference numeral 6 designates a gate insulating film, reference numeral 7 designates a control gate, reference numeral 9 designates a source region, reference numeral 10 designates a drain region, and reference numeral 11 designates a channel forming region.

Since the interface levels 4a and the trap levels 4b, which retain charges, are distributed in a spatially discrete manner, charge leakage only occurs locally even if dielectric breakdown is caused at a location in the tunnel insulating film. Hence, the charge retention ability of the memory cell does not change significantly before and after occurrence of the dielectric breakdown.

For such reasons, MONOS memory is more excellent than the floating-gate-type flash memory in terms of the endurance and is regarded as being advantageous in terms of miniaturization or the like of the memory cells since the physical thickness of the tunnel insulating films can be made relatively thin. However, for, e.g., the reason why the depth of the trap levels of the SiN$_x$ film (the energy difference between the trap level and the bottom of the conduction band for electrons, and the energy difference between the trap level and the top of the valence band for holes) is not necessarily enough, a charges that are once trapped is likely to escape, therefore MONOS memory is disadvantageous in that the absolute charge retention ability (the charge retention ability of a device, which is in a normal state and is subjected to no dielectric breakdown) is low.

On the other hand, as a method for dealing with the dielectric breakdown of the oxide film by retaining charges in a discrete manner as in MONOS memory and for further enhancing the absolute charge retention ability than the MONOS memory, a structure wherein floating gate is replaced by a plurality of nano-particles and the nano-particles are dispersed in the gate insulating film, has been considered. In FIG. 4, an example of semiconductor memory devices wherein nano-particles are formed from Si nano-particles is shown as a typical device having this structure. The same reference numerals as the elements in FIG. 3 indicate the same elements except for an charge retention region 4 in FIG. 4. A memory having this structure is disclosed in, e.g., JP-A-11-186421. This publication discloses a structure wherein a floating gate 4, which comprises a group of a plurality of Si nano-particle formed by a CVD method, is formed on a tunnel insulating film 2, and wherein the floating gate is covered with a gate insulating film 6.

However, the currently available Si nano-particles have a size of from about 5 to about 10 nm and an in-plane distribution density (area density) of from 1 to $2\times10^{12}$/cm$^2$, and these values are insufficient in terms of memory function.

When the area density of nano-particles that function as a charge retention part is low, the memory window (the shift width of threshold voltage in a MOS transistor) of the flash memory is narrowed since the area density of the amount of retained charges is also lowered. At the same time, dispersion in the area density of the amount of charges among semiconductor memory cells, are likely to be relatively large, which has an adverse influence on dispersion in the size of the memory window. Both phenomena make data reading operation unstable.

Therefore, it is necessary to increase the area density while ensuring a distance among nano-particles and maintaining a discrete state. However, in the formation by the CVD method disclosed in JP-A-11-186421, when a manufacturing condition is changed in order to increase the area density of the nano-particles, the nano-particles cannot be formed with a sufficient area density since adjacent nano-particles are likely to agglomerate and since the discrete state cannot be maintained.

Further, recently, a research on single-electron memory, which is ultrafast and extremely low power consumption memory, has been actively carried out. As one of the conditions to realize single-electron memory, it is necessary to exhibit the Coulomb blockade effect (wherein energy barriers that restrain surrounding electrons from approaching are generated by the electrostatic potential field of accumulated electrons, and further, the electrons are prevented from moving beyond the energy barriers in the sense of statistical thermodynamics since the energy barriers have a higher level than the thermal energy of the electrons) at room temperature. In order to exhibit this effect, it is essential that the size of the floating gate 4 be decreased.

In order for single-electron memory to stably functions at room temperature, it is said that the size of the floating gate 4 has to be reduced to have a diameter of about 1 nm. However, the smallest particle size of currently available nano-particles has remained at about 5 nm. Since it is necessary for at least one nano-particle to be formed in the gate region of a quite miniaturized single-electron memory with a high probability, it is required to have a high nano-particles formation density. From this viewpoint, the currently available area density of about $10^{12}$/cm$^2$ is insufficient. Further, in order to accomplish such the area density, a quite peculiar pre-treatment is necessary which causes a problem of making the fabrication process complicate.

It is an object of the present invention to provide a nonvolatile semiconductor memory device having a structure that is capable of solving the problems to be overcome in the conventional flash memory, specifically, is capable of reducing the time required for writing and erasing operation and preventing charge retention characteristic from being deteriorated by repetition of rewriting operation, and to provide a process for producing the nonvolatile semiconductor memory device with good reproducibility.

DISCLOSURE OF THE INVENTION

The present invention provides a nonvolatile semiconductor memory device comprising a source region and a drain region formed on a surface of a semiconductor substrate; a tunnel insulating film formed in contact with a channel forming region so as to connect the source region and the drain region, the channel forming region being sandwiched between the source region and the drain region; a charge retention layer formed so as to be adjacent to the tunnel insulating film; a gate insulating film formed so as to be adjacent to the charge retention layer, and a control gate formed so as to adjacent to the gate insulating film, characterized in that the charge retention layer is an insulating matrix containing, per one nonvolatile semiconductor memory cell, one nano-particle which is made of at least one type of single-element substance or at least one type of chemical compound that functions as a floating gate and has a particle size of at most 5 nm, or containing a plurality of such the nano-particles independently dispersed with a density of from $10^{+12}$ to $10^{+14}$ particles per square centimeter of the charge retention layer.

The present invention also provides a nonvolatile semiconductor memory device comprising a source region and a drain region formed on a surface of a semiconductor substrate; a tunnel insulating film formed in contact with a channel forming region so as to connect the source region and the drain region, the channel forming region being sandwiched between the source region and the drain region; a charge retention layer formed so as to adjacent to the tunnel insulating film; a floating gate formed so as to adjacent to the charge retention layer, a gate insulating film formed so as to adjacent to the floating gate, a gate insulating film formed so as to adjacent to the floating gate, and a control gate formed so as to adjacent to the gate insulating film, characterized in that the charge retention layer has a function to help electrons to transfer toward the floating gate from the channel forming region and to make it suppression that electron transfer toward the channel forming region from the floating gate.

The present invention also provides the nonvolatile semiconductor memory device, wherein the charge retention layer is an insulating matrix containing a plurality of nano-particles which are made of at least one type of single-element substance or at least one type of chemical compound having a particle size of at most 5 nm, and which are independently dispersed with a density of from $10^{+12}$ to $10^{+14}$ particles per square centimeter.

The present invention also provides the nonvolatile semiconductor memory device, wherein the nano-particles constituting the charge retention layer, are made of at least one type of single-element substance or at least one type of chemical compound selected from the group consisting of a metal, an oxide, a carbide, a nitride, a silicide and a boride.

The present invention also provides the nonvolatile semiconductor memory device, wherein the insulating matrix constituting the charge retention layer is made of at least one type of chemical compound selected from the group consisting of an oxide, a carbide, a nitride, a boride, a silicide, and a fluoride.

The present invention also provides the nonvolatile semiconductor memory device, wherein the nano-particles constituting the charge retention layer are dispersed two-dimensionally or three-dimensionally in the insulating matrix.

The present invention also provides a process for producing the nonvolatile semiconductor memory device that has the charge retention layer wherein the nano-particles are dispersed two-dimensionally or three-dimensionally in the insulating matrix, characterized by forming the charge retention layer in a self-organizing manner by physical vapor deposition of each material to constitute the nano-particles and the insulating matrix.

The present invention further provides the process for producing the nonvolatile semiconductor memory device of which the physical vapor deposition is performed by a sputtering method.

BEST MODE FOR CARRYING OUT THE INVENTION

Figure 1:
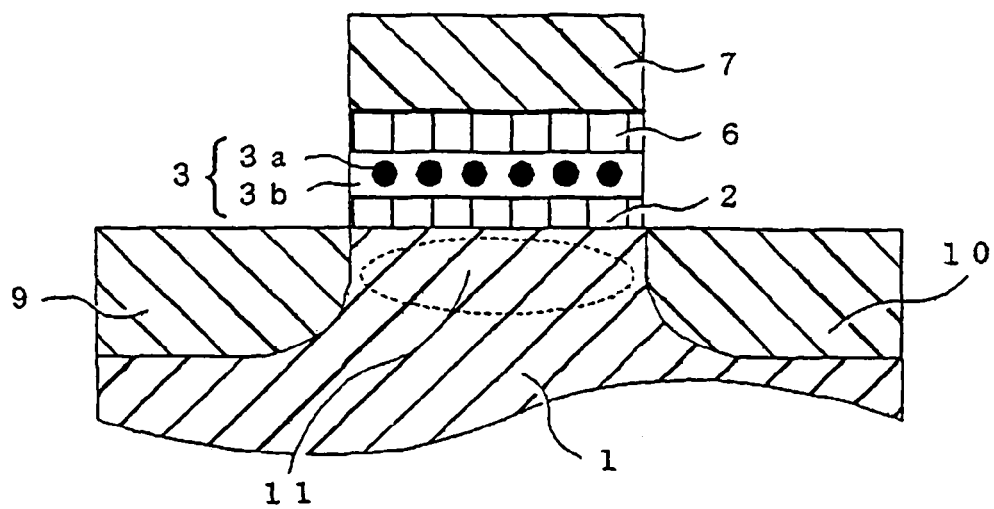
FIG. 1 is a schematic cross-sectional view showing an embodiment of the nonvolatile semiconductor memory cell according to the present invention.

In the present invention, a charge retention layer contains, per nonvolatile semiconductor memory cell, one nano-particle which is made of at least one type of single-element substance or at least one type of chemical compound that functions as a floating gate and has a particle size of at most 5 nm, or contains such the nano-particles independently dispersed with a density of from $10^{+12}$ to $10^{+14}$ particles per square centimeter of the charge retention layer.

A memory device containing one nano-particle per nonvolatile semiconductor memory cell, namely, per one memory cell may be utilized as a single-electron device.

Among single-electron devices, single-electron memory, which provide one electron with one bit information, put one electron into a floating gate as an electron container or releases one electron from the floating gate.

In single-electron memory, it is important that the number of moving electrons be one, i.e., the ultimate minimum. For this reason, the power consumption required for data writing operation can be lowered to the minimum, in addition, the stress of a tunnel insulating film that is given by electron transmission is suppressed to the minimum. Thus, the endurance characteristic is advanced in leap.

In order to put single-electron memory to practical use, several element technologies have to be established. As one of the technologies, there is a technology to form nano-particles with a particle size (diameter) of about 1 nm. This element technology is essential for stabilizing operating characteristics of single-electron memory, and the reason will be explained below. For stabilizing the operating characteristics of single-electron memory, the motion of a carrier such as an electron or a hole has to be dominated only by an externally controlled voltage, and the influence of thermal disturbance which brings about disorder of the carrier motion has to be minimized as much as possible.

In order to prevent a carrier from disorderly invading in a floating gate by the thermal energy of the carrier, it has been currently considered to utilize the Coulomb blockade effect. However, in order to exhibit the Coulomb blockade effect, it is necessary to sufficiently reduce the capacitance formed between a channel forming region or a source region and a floating gate, i.e., to reduce the size of the floating gate. Specifically, it is said to be required to reduce the particle size to about 1 nm for the thermal energy at room temperature.

As one of the element technologies relating to the production of single-electron memory devices, there is a technology to certainly form one floating gate as an charge storage box directly under a control gate. In single-electron memory, the size of a control gate forming region becomes very small, and the size is expected to be about 10 nm×10 nm or less.

As a method to certainly form one floating gate in a region having this size, there is proposed a method for spontaneously or artificially forming nano-particles one by one in a row in the forming regions of the respective control gates of an integrated memory device or a method for removing unwanted nano-particles after forming nano-particles at random locations. In the present circumstances, the latter technology is a more practical one. However, since nano-particles are scattered at random locations, an area density of at least $10^{12}/cm^2$ or more for formation is required in order for nano-particles to certainly be distributed in a region having an area of 10 nm square or less.

Further, considering local dispersion of locational distribution, it is necessary for nano-particles to be preferably formed with an area density of from about $10^{13}$ to $10^{14}/cm^2$. From this viewpoint, as a technology for manufacturing single-electron memory device, it is essential to develop a technology to form nano-particles with a quite high density, specifically, for example, with an area density of from $10^{12}$ to $10^{14}/cm^2$.

An embodiment of the nonvolatile semiconductor memory device according to the present invention is shown as a schematic cross-sectional view in FIG. 1. In FIG. 1, reference numeral 1 designates a p-type single crystal Si substrate, reference numeral 2 designates a tunnel insulating film, and reference numeral 3 designates an charge retention layer, wherein nano-particles 3a as nano-particles are dispersively contained in an insulating matrix 3b. Reference numeral 6 designates a gate insulating matrix, and reference numeral 7 designates a control gate. Reference numeral 9 designates a source region, reference numeral 10 designates a drain region, and reference numeral 11 designates an approximate region wherein a channel is formed, namely, a channel forming region.

The p-type single crystal Si substrate 1 may comprise an SOI (Silicon On Insulator) substrate having a buried oxide film, which is suitably employed in a case wherein an attempt is made to realize an improvement in operation speed or a reduction in power consumption. The tunnel insulating film 2 may suitably comprise an oxide film, which has a relatively good boundary matching with the p-type single crystal Si substrate 1, or a material having a high dielectric constant in order to increase the controllability of an electric field distribution of the channel forming region 11 by control gate voltage, such as, a material of $SiO_xN_y$ ($0 \leq X < 2$, $0 < y \leq 4/3$).

In order to perform data writing/erasing operation at a high speed, it is preferred that the film thickness of the tunnel insulating film be as thin as possible, in particular at most 8 nm. It is extremely preferable in terms of fast operation that the film thickness be at most 5 nm.

It is preferred that the nano-particles 3a constituting the charge retention layer 3 are dispersed in a large number in order to suppress the loss amount of accumulated charges by dielectric breakdown of the tunnel insulating film 2 as low as possible, and it is preferred that the nano-particles be positioned at certain intervals so as to be electrically insulated from one another. On the other hand, for the purpose of increasing the shift amount of threshold voltage ($\Delta V_{th}$) by presence or absence of an accumulated charge to nano-particles, and of suppressing dispersion in the shift amount of the threshold voltage, it is preferred that the nano-particles in the charge retention layer have a high area density, in particular from $10^{12}$ to $10^{14}/cm^2$. Although the value of the area density conforms to the value of the area density referred to in explanation of single-electron memory devices, it is not necessarily meant that the number of the nano-particles is one per single-electron memory device in this case.

In order to suppress charge transmission by the tunnel effect between adjacent nano-particles while increasing the density of the nano-particles, the nano-particles are made to have a particle size of at most 5 nm. It is preferred to select a material having a high electron affinity (when the nano-particles are made of a semiconductor or insulating material) or a high work function (when the nano-particles are made of a good conductive material, such as metal) as the material of the nano-particles, or it is preferred to select a material having a low electron affinity as the material of the insulating matrix 3b. And, at the same time, it is preferred to employ a high melting point material having resistance to high-temperature treatment in a semiconductor manufacturing process, for formation of the nano-particles and the insulating matrix 3b. The specific names of materials suitable for the nano-particles and the insulating matrix will be described later.

From the viewpoint of increasing the controllability of the electric field distribution of the channel forming region 11 by control gate voltage and of speeding up discharge operation when erasing data, it is preferred to make the physical thickness of the insulating film 6 thin, and it is preferred to select a material having a high dielectric constant for formation of the insulating film. Specifically, the thickness is preferably at most 10 nm, and a $SiO_xN_y$ material as stated earlier or laminated films of $SiO_2$ films and $SiO_x$ films in addition to a $SiO_2$ material may be suitably employed for the insulating film.

Figure 2:
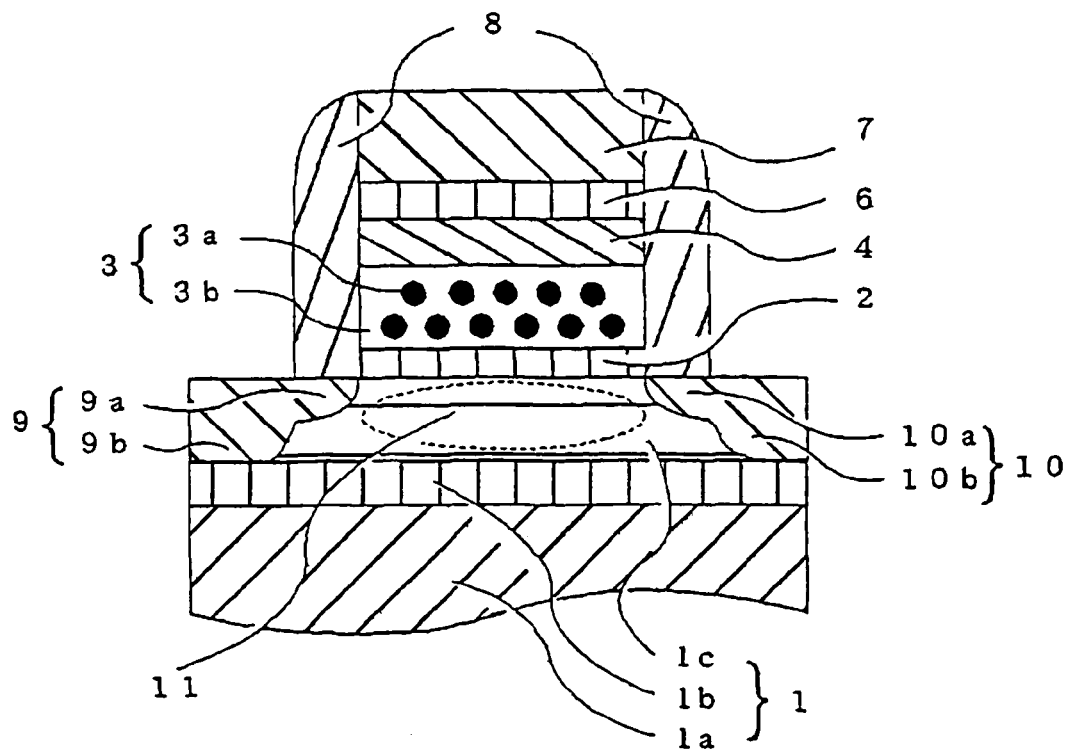
FIG. 2 is a schematic cross-sectional view showing another embodiment of the nonvolatile semiconductor memory cell according to the present invention.
Figure 3:
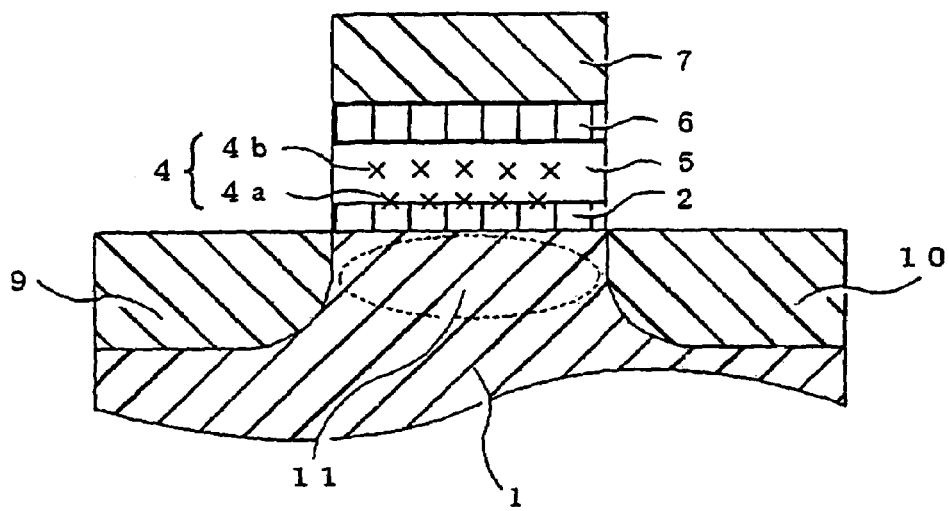
FIG. 3 is a schematic cross-sectional view showing a conventional MONOS memory cell.
Figure 4:
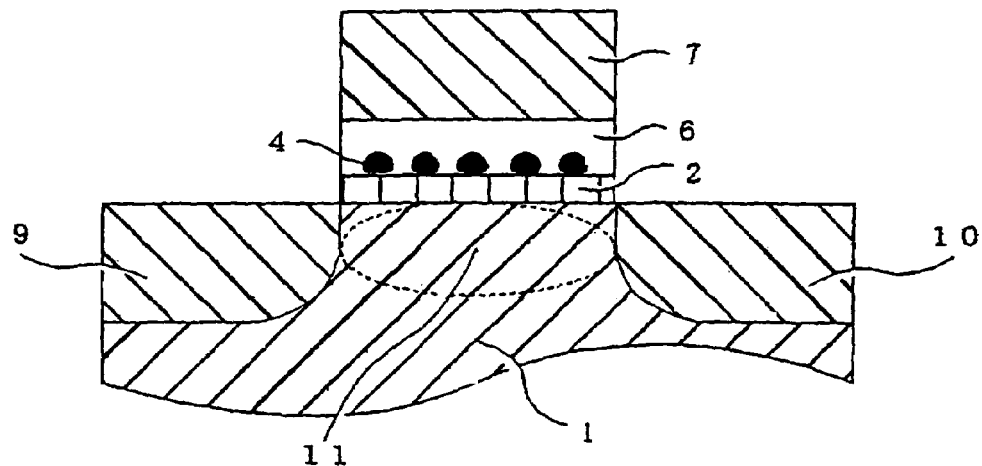
FIG. 4 is a schematic cross-sectional view showing a conventional semiconductor memory cell containing Si nano-particles in a discrete manner.

Another embodiment of the nonvolatile semiconductor memory device according to the present invention is shown as a schematic cross-sectional view in FIG. 2. In FIG. 2, a substrate 1 for forming a memory device comprises an SOI substrate, and the substrate 1 is constituted from three layers of a p-type single crystal Si substrate 1a, a buried oxide film 1b and a p-type SOI layer 1c. Reference numeral 2 designates a tunnel insulating film, and reference numeral 3 designates a charge retention layer, wherein nano-particles 3a are dispersively contained in an insulating matrix 3b. Reference numeral 4 designates a floating gate, reference numeral 6 designates a gate insulating film, reference numeral 7 designates a control gate, and reference numeral 8 designates a sidewall. Reference numeral 9 designates a source region, and reference numeral 10 designates a drain region. In each of the regions, reference numerals 9a and 10a designate shallow junction regions, and reference numerals 9b and 10b designate contact regions. Reference numeral 11 designates an approximate region wherein a channel is formed, namely, a channel forming region.

The tunnel insulating film 2 may be made of an oxide film, which has a good boundary matching with the p-type SOI layer 1c, or a material, which has a high dielectric constant in order to increase the controllability of an electric field distribution of the channel forming region 11 by control gate voltage, such as a $SiO_xN_y$ material as stated earlier. In order to perform data writing/erasing operation at a high speed, it is preferred that the film thickness of the tunnel insulating film 2 be as thin as possible, in particular at most 3 nm in consideration of the presence of the charge retention layer 3 stated later.

The charge retention layer 3 has a function of helping electrons to transfer from the channel forming region 11 toward the floating gate 4 and of suppressing electrons to transfer from the floating gate 4 toward the channel forming region 11. The details will be explained below.

The charge retention layer 3 is a layer which is disposed to suppress leakage of charges to the substrate, the charges having been accumulated in the floating gate 4 next to the charge retention layer 3. When charges are accumulated, the charges are dispersively accumulated not only in the floating gate 4 but also in nano-particles 3a in the charge retention layer 3. Because the accumulated charges of nano-particles 3a have the Coulomb blockade effect on the accumulated charges in the floating gate 4, the leakage of the accumulated charges in the floating gate 4 toward the substrate is suppressed. The charge retention layer 3 is also effective in increase the writing speed.

When data is written, a high voltage is applied between the channel forming region 11 and the control gate 7, electrons are injected from the channel forming region 11 to the floating gate 4 by the electric field generated by the voltage. When nano-particles 3a exist between the channel forming region 11 and the floating gate 4, the injection probability increases, and the writing speed increases because electrons are injected into the floating gate 4 by way of the nano-particles 3a.

The writing operation may be performed even by application of a lower voltage. It is preferred that the nano-particles in the charge retention layer have a high charge retention ability. From the viewpoint of increasing the charge retention ability in the entire charge retention layer to eventually suppress the leakage of the charges retained in the floating gate 4, it is preferred that the nano-particles are dispersed with high density.

It is also effective from the viewpoint of increasing the charge retention ability that the nano-particles have a three-dimensional multilayered structure with at least two layers of the nano-particles in order to increase the charge retention ability of the nano-particles. On the other hand, it is preferred that the respective nano-particles have a small size in order to exert the Coulomb blockage effect on the accumulated charges of the floating gate in a sufficient way. It is preferred that the area density of the nano-particles be as high as $10^{12}$ to $10^{14}/cm^2$.

In order to satisfy both requirements of securing an electrical insulating characteristic of mutual nano-particles and increasing the dense of the nano-particles, it is preferable, from the viewpoint of increasing the charge retention, to reduce the size of the nano-particles to at most 5 nm, to use a material having a high electron affinity (in a case wherein the material of the nano-particles is a semiconductor or an electrically insulating material) or a large work function (in a case wherein the material of the nano-particles is a metal or the like) as the material of the nano-particles, and to select a material having a small electron affinity as the material of the insulating matrix 3b. At the same time, it is preferable to employ a high melting point material having resistance to high-temperature treatment in a semiconductor manufacturing, for formation of the nano-particles and the insulating matrix. The specific names of materials suitable for the nano-particles and the insulating matrix will be described later.

In order to increase the controllability of the electric field distribution in the channel forming region 11 by control gate voltage and to speed up the writing or erasing operation, a material having a high dielectric constant, such as a $SiO_xN_y$ material or laminated films of oxide films and $SiN_x$ films may be suitably employed for the insulating gate 6. Likewise, in order to increase the controllability of the electrical field distribution and high-speed operability, it is preferable to make the insulating film 6 as thinner as possible, in particular to reduce the thickness of the film to at most 10 nm.

The charge retention layer is formed by employing a physical vapor deposition method. As methods for forming a thin film, besides the physical vapor deposition method, for example, a chemical vapor deposition method (chemical vapor deposition method, also known as a CVD method) has been also well known. However, in the CVD method, a single-phase film containing no separate phases, or a film having a high degree of crystallinity, that is to say, a film in an equilibrium phase is likely to be formed for, e.g., reasons that there is a high collision frequency between reactive atomic species and reactive molecular species in the vapor phase since the vapor phase pressure at film deposition is higher than physical film deposition, and that the vapor phase and the substrate surface has a high temperature. Therefore, the chemical vapor deposition method is not suitable in a case wherein the nano-particles and the insulating matrix are separated as in the charge retention layer of the present invention, that is to say, wherein a film in a quasi-equilibrium phase or a nonequilibrium phase is formed.

The charge retention layer may be formed with a one-step process by a physical vapor deposition method. Examples of physical vapor deposition method are a sputtering method, a thermal vapor deposition method, an electron beam vapor deposition method, a laser ablation method and a molecular beam epitaxy method. Among them, the sputtering method is particularly preferable for, e.g., reasons that it is possible to have a wide selection of film deposition materials, that it is easy to obtain a compact film and that it is possible to obtain a film having a good adhesive property with the foundation layer, and additionally that it is preferred for mass production.

Also, the sputtering method is preferable because it is possible to obtain a substrate temperature suitable for self-organization in the present invention. The self-organization can be promoted by causing particles of species for film deposition to appropriately migrate on a surface of the substrate, for example, because it is possible to obtain an appropriate substrate temperature, which is neither too high nor too low.

As a sputtering system, one employing inductively coupled plasma or electromagnetic wave coupled plasma, or one employing a facing targets system is more preferable because of minimizing damage to the tunnel oxide film as the foundation layer.

When the charge retention layer is formed by the sputtering method, there is no particular limitation to a method to constitute a target by employing materials to form a dispersed phase as a nano-particle phase and materials to form a matrix phase as an insulating matrix phase. One that is obtainable by sintering powder materials of both phases, or one that is obtainable by embedding an appropriate number of chip pieces of the materials of one of the phases in a single phase target of the material of the other phase so as to be exposed on a surface of the single phase target may be employed.

When a sputtering face of the target is set vertically upward in the film disposition chamber of a film deposition system, one that is obtainable by putting an appropriate number of chip pieces of the material of one of the phases on the single phase target of the material of the other phase, or one that is obtainable by only spreading mixed power of both phases in a glass petri dish or the like may be also employed as the target. In this regard, a powder target is not preferable for producing a semiconductor chip, e.g., because there is a possibility that the powder can be scattered in a film depositing environment to have an adverse effect on another semiconductor manufacturing process.

As a combination of a material in a dispersed phase and a material in a matrix phase in a case of forming the charge retention layer, a combination wherein the material of the dispersed phase and the material of the matrix phase undergo phase separation on film disposition, and wherein the work function or the electron affinity of the dispersed phase is greater than the electron affinity of the matrix phase is applicable.

The self-organization of the present invention means that a group of atoms constituting for the nano-particles and a group of atoms constituting for the insulating matrix are separately disposed in a spontaneous manner by, e.g., the thermodynamic interaction, and that consequently, nano-particles are assembled on a nanoscale in the insulating matrix. This phenomenon depends on, e.g., a combination of the constituent material of the nano-particles and the constituent material of the insulating matrix, an existence ratio therebetween, and a film deposition condition, such as, a film deposition pressure or a substrate temperature.

By selecting suitable materials for the nano-particles and the insulating matrix in the present invention and properly selecting sputtering conditions, the action for self-organization can be relatively easily utilized to form the charge retention layer. By the sputtering method, it is possible to obtain a thermodynamic condition in a range appropriate for exhibiting the self-organization of the present invention.

As the material for the dispersed phase, any one of a metal, a semiconductor and an insulator may be selected. However, it is more preferable to select a substance, which has as large a work function and as large an electron affinity as possible for the purpose of having a better charge retention ability, and which has a high melting point for the purpose of being stabilized in heat treatment in the semiconductor manufacturing process.

The nano-particles that are made of a metal may be made of an element, such as, Al, Ti, Zn, Ga, Zr, Nb, Mo, Re, Ru, In, Sn, La, Ta, Pt, W, Pb, Ag, Au or Pd, or a 3d transition metal element, such as, V, Cr, Mn, Ni, Fe, Co, or Cu, and/or an alloy containing one of them as a major component.

The nano-particles, which are made of an elemental semiconductor, are preferably made of at least one substance of Si, Ge, Se and Te. The nano-particles may contain at least one of elements, such as P, As, Sb, B, Al, Ga, In and Cu, as an impurity in at least one of semiconductors, such as, Si, Ge, Se and Te.

The nano-particles that are made of a compound semiconductor or an insulator are preferably made of at least one of compound of InAs, InGaAs, InGaNAs, InAlAs, InAsP, InGaAsP, InSb, InGaSb, InAlSb, InGaAsSb, SiC, $Cu_2O$, ZnO, CdO, BaO, PbO, NiO, $In_2O_3$, $Sb_2O_3$, $SnO_2$, $Ag_2O$, AgO, $RuO_2$, $V_3Ga$, $Nb_3Sn$, $Nb_3Al$, $Nb_3Ga$, $Nb_3Ge$, NbTi, $NbMo_6S_8$, ZnS, CdS, HgS, PbS, $Sb_2S_3$, $Bi_2S_3$, ZnSe, CdSe, HgSe, SnSe, PbSe, $In_2Se_3$, $Sb_2Se_3$, $BiSe_3$, ZnTe, CdTe, HgTe, SnTe, PbTe, $In_2Te_3$, $Bi_2Te_3$, BN, GaN, InT, TiN, BP, AlP, GaP, InP, $Zn_3P_2$, $Cd_3P_2$, $ZnP_2$, $CdP_2$, AlAs, GaAs, $Zn_3As_2$, $Cd_3As_2$, $ZnAs_2$, $CdAs_2$, AlSb, GaSb, ZnSb, CdSb and $Si_3N_4$.

The nano-particles that are made of a compound semiconductor or an insulator may contain at least one of elements of Sn, Sb, Ga, Al and In, as an impurity in at least one selected from the substances group consisting of $In_2O_3$, $Sb_2O_3$, $SnO_2$, ZnO and GaAs.

An example of the material of the insulating matrix in the charge retention layer is at least one compound selected among an oxide, such as silica, alumina, titania, mullite, cordierite, spinel, zeolite or forsterite; carbide, such as boron carbide ($B_4C$); nitride, such as silicon nitride, boron nitride or aluminum nitride; and fluoride, such as magnesium fluoride or aluminum fluoride. It is more preferable to select a substance, which has as low an electron affinity as possible for a better charge retention ability, and which has a high melting point for the purpose of being stabilized heat treatment in the semiconductor manufacturing process.

In the process forming the charge retention layer by the sputtering method, the average particle size of the dispersed phase growing in the matrix phase is changed by controlling the target composition and the film deposition condition. Particularly, it was observed that the average particle size changed according to the volume fraction of a target between the dispersed phase and the matrix phase and according to the film deposition condition (such as, an Ar gas pressure or a substrate temperature on sputtering). For example, in a case wherein a target of Co—$SiO_2$ is employed to form a film having metal nano-particles of Co dispersed in a $SiO_2$ insulating matrix, when film deposition was performed with a target comprising Co and $SiO_2$ having a volume ratio of 50:50, it was observed that the particle size of the particles was about 2 nm for formation under an Ar gas pressure of 0.5 Pa while the size of the Co particles was about 5 nm for formation under an Ar gas pressure of 8 Pa.

The charge retention layer of the nonvolatile semiconductor memory device according to the present invention, wherein a material having a large work function or a large electron affinity comprises nano-particles having a particle size of at most 5 nm, and wherein a thin film having the nano-particles dispersed with a high density in the insulating matrix is employed, can independently retain a large number of charges in a dispersed manner. By this independent and dispersed retention, even when dielectric breakdown of the tunnel insulating film occurs, only a small portion of the total charge amount that is retained in the charge retention layer leaks, and a threshold voltage shift sufficient for data reading can be ensured even after occurrence of dielectric breakdown. And, this independent and dispersed retention can realize thinner tunnel insulating film, smaller memory cell size and lower operation voltage.

The charge retention layer of the nonvolatile semiconductor memory device according to the present invention, wherein a material having a large work function or a large electron affinity comprises nano-particles having a particle size of at most 5 nm, and wherein a thin film having the nano-particles dispersed with a high density in the insulating matrix is employed, can reduce the electric capacities which are formed between individual nano-particles, between the nano-particles and the semiconductor substrate, and between the nano-particles and the floating gate.

Here, an energy difference ($\Delta\in$) of nano-particles by electrification can be represented as $\Delta\in = q^2/2C$, wherein the amount of accumulated charges is q, and an electrical capacity is C. It is found that the greater the amount of the retained charges, and/or the smaller the electric capacity C is, the greater the energy difference of charged nano-particles is. Therefore, the charge retention layer containing the nano-particles is capable of effectively having the Coulomb blockade effect on charges those are retained by adjacent nano-particles or by the floating gate adjacent to the charge retention layer.

Additionally, by employing the sputtering method when forming the charge retention layer, various composition materials can be selected for the dispersed phase and the matrix phase. Since it is easily possible to incorporate the sputtering method into a conventional semiconductor manufacturing process as a film deposition process, it is possible to provide a high performance nonvolatile semiconductor memory device with good reproducibility and without major modifications in the conventional process.

Now, examples of the present invention will be explained.

EXAMPLE 1

The nonvolatile semiconductor memory device in this example will be explained, referring to FIG. 1. A tunnel insulating film 2 was formed on a p-type single-crystal Si substrate 1. The tunnel insulating film 2 was prepared by subjecting a semiconductor substrate to thermal oxidation at 800° C. and had a thickness of 3 nm.

Then, a charge retention layer 3, which was constituted from an insulating matrix 3b containing nano-particles 3a for charge retention, was formed so as to have a thickness of 7 nm by a capacitively coupled type magnetron sputtering method as described below. Metal Co and $SiO_2$ were selected for the nano-particles and the insulating matrix, respectively. When sputtering, a composite target which comprised a metal Co target having a diameter of 6 inches (15.24 cm) and $SiO_2$ glass chips having 5 mm square and placed thereon was employed. The amount of the $SiO_2$ glass chip was adjusted to occupy 70% of the area of the surface that was exposed to plasma of the target.

After evacuating the film deposition chamber of a sputtering apparatus to $5\times10^{-4}$ Pa, an Ar gas was introduced, and the gas flow rate was controlled so as to have a gas pressure of 0.5 Pa in the film deposition chamber. Plasma was generated by applying a high-frequency power (13.56 MHz) of 400 W. The substrate was heated up to about 200° C. on film deposition. The Co—SiO$_2$ composite film thus formed was observed by a TEM (Transmission Electron Microscope). It was observed that Co crystal nano-particles having an average particle size of 3 nm were dispersed with an area density of about $1\times10^{13}/$cm$^2$ in amorphous SiO$_2$.

After forming a SiO$_x$N$_y$ film as a gate insulating film 6 on the Co—SiO$_2$ composite film, a phosphorus doped polysilicon layer as the control gate 7 was formed by CVD. A photoresist layer was formed as a mask. Portions of the control gate 7 of the polysilicon, the gate insulating film 6, the charge retention layer 3 and the tunnel insulating film 2, which were not covered with the mask, were removed by a dry etching method to form a gate structure. And then, a source region 9 and a drain region 10 were formed by arsenic ion implantation (arsenic may be replaced by phosphorus) and by annealing.

After preparing a MOS diode having a layered structure which comprised the tunnel oxide film 2, the charge retention layer 3 and the gate oxide film 6, the capacity-voltage characteristics of the diode were measured. The measurements showed that a hysteresis phenomenon of 2.2 V occurred by electron injection to a Co dot.

EXAMPLE 2

The nonvolatile semiconductor memory device in this example will be explained, referring to FIG. 2. By a mesa separation method, each device cell on an SOI substrate was isolated, the SOI substrate comprised a p-type single-crystal Si substrate 1*a*, a buried oxide film 1*b* and a p-type SOI layer 1*c*. An oxide film as a tunnel insulating film 2 was formed on the p-type SOI layer 1*c* so as to have a thickness of 1.5 nm by thermal oxidation at 800° C.

And then, a charge retention layer 3 which comprised an insulating matrix 3*b* three-dimensionally containing nano-particles 3*a* was formed so as to have a thickness of 10 nm by a sputtering method in the manner described below. A thin film comprising two-phases of Pt and SiO$_2$ was formed. When sputtering, a composite target with a diameter of 6 inches (15.24 cm) which was prepared by mixing Pt powder and SiO$_2$ powder with a volume proportion of 20:80 and then sintering the mixture was employed.

After evacuating the film deposition chamber of the sputtering apparatus to $5\times10^{-4}$ Pa, an Ar gas was introduced, and the gas flow rate was controlled so as to have gas pressure of 0.5 Pa in the film deposition chamber. Plasma was generated by applying a high-frequency power (13.56 MHz) of 400 W. The substrate was heated up to about 200° C. on film deposition. The Pt—SiO$_2$ composite film thus formed was observed by the TEM. It was observed that Pt crystal particles having an average particle size of 2 nm were dispersed in the SiO$_2$ insulating matrix in an amorphous state.

Next, a film of Si poly crystal as a floating gate 4 was deposited by CVD, a SiO$_2$ film was further deposited on the Si film by CVD, and then a SiN$_x$ layer was formed as a gate insulating film 6 by thermal nitriding. After depositing a phosphorus doped polysilicon layer as a control gate 7 by CVD, the control gate 7, the gate insulating film 6, the floating gate 4, the charge retention layer 3 and the tunnel insulating film 2 were partially removed by a dry etching method to form a gate structure.

And then, phosphorus ion implantation (phosphorus may be replaced by arsenic) was performed with shallow penetration by low energy to form shallow junction regions 9*a* and 10*a*. The gate structure which specifically comprised the tunnel insulating film 2, the charge retention layer 3, the floating gate 4, the gate insulating film 6 and the control gate 7 was once entirely covered by a SiO$_2$ film deposited by CVD. A side-wall 8 was formed by partially etching (etching back) the SiO$_2$ film by a dry etching method.

Further, phosphorus ion implantation (phosphorus may be replaced by arsenic) was performed with slightly deeper penetration by high energy to form contact regions 9*b* and 10*b*. A source region 9 and a drain region 10 were formed by annealing.

INDUSTRIAL APPLICABILITY

The nonvolatile semiconductor memory device according to the present invention can shorten data writing and erasing time, significantly improve the endurance characteristic and be operated with low power consumption in comparison with conventional similar memory devices.

Accordingly, the nonvolatile semiconductor device according to the present invention can be applied to equipment and a technical field that conventional nonvolatile semiconductor devices have not been applied to. It is supposed that the nonvolatile semiconductor device according to the present invention can be widely applied to mobile information devices, can make PC-carried memories non-volatilization due to replacement from DRAM and can be also applied to single-electron device that is said to be ultimate memory device.

And, by employing a sputtering method, it is possible to widely select materials comprising various compositions as the material to form nano-particles and to relatively freely control the particle size of the nano-particles by changing a deposition condition. Thus, it is possible to relatively freely combine suitable materials for a purpose. For example, in a case of selecting a magnetic metal or a magnetic semiconductor as the material of the nano-particles, it is possible to fabricate a novel magnetic device and an optical device due to quantum effect. And, by employing a sputtering method, it is possible to easily incorporate the method according to the present invention into a conventional semiconductor production process. Further, it is possible to form an artificial lattice by laminating various sorts of materials alternately.

The entire disclosure of Japanese Patent Application No. 2002-213900 filed on Jul. 23, 2002 including specification, claims, drawings and summary is incorporated herein by reference in its entirety.

What is claimed is:

1. A process for producing a nonvolatile semiconductor memory device comprising:
    forming a source region and a drain region on a surface of a semiconductor substrate;
    forming a tunnel insulating film on the semiconductor substrate, the tunnel insulating film being in contact with a channel forming region of the semiconductor substrate between the source and drain regions;
    forming a charge retention layer adjacent the tunnel insulating film;
    forming a gate insulating film adjacent the charge retention layer; and
    forming a control gate adjacent the gate insulating film,
    wherein the charge retention layer is an insulating matrix containing a plurality of nano-particles which are made of at least one type of single-element substance or at least one type of chemical compound, each nano-particle configured to function as a floating gate and having a particle size of at most 5 nm and which are independently dispersed with a density of from $10^{12}$ to $10^{14}$ particles per square centimeter of the charge retention layer, and the charge retention layer is formed by a sputtering method employing inductively coupled plasma or electromagnetic wave coupled plasma, and a target is constituted by employing materials to form a dispersed phase as a nano-particle phase and materials to form a matrix phase as an insulating matrix phase.

2. The process according to claim 1, wherein the nano-particles are made of at least one type of single-element substance or at least one type of chemical compound selected from the group consisting of a metal, an oxide, a carbide, a nitride, a silicide and a boride.

3. The process according to claim 1, wherein the insulating matrix is made of at least one type of chemical compound selected from the group consisting of an oxide, a carbide, a nitride, a boride, a silicide, and a fluoride.

4. The process according to claim 1, wherein the nano-particles are dispersed two-dimensionally or three-dimensionally in the insulating matrix.

* * * * *